(12) United States Patent
Yoneda

(10) Patent No.: US 11,285,700 B2
(45) Date of Patent: Mar. 29, 2022

(54) MULTILAYER LAMINATE AND METHOD FOR PRODUCING MULTILAYER PRINTED WIRING BOARD USING SAME

(71) Applicant: Mitsui Mining & Smelting Co., Ltd., Tokyo (JP)

(72) Inventor: Yoshihiro Yoneda, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 16/082,393

(22) PCT Filed: Feb. 3, 2017

(86) PCT No.: PCT/JP2017/003966
§ 371 (c)(1),
(2) Date: Sep. 5, 2018

(87) PCT Pub. No.: WO2017/154432
PCT Pub. Date: Sep. 14, 2017

(65) Prior Publication Data
US 2019/0110364 A1     Apr. 11, 2019

(30) Foreign Application Priority Data

Mar. 10, 2016 (JP) .................... PCT/JP2016/057563

(51) Int. Cl.
*B32B 15/08*      (2006.01)
*B32B 15/20*      (2006.01)
(Continued)

(52) U.S. Cl.
CPC ............... *B32B 15/08* (2013.01); *B32B 7/02* (2013.01); *B32B 15/20* (2013.01); *B32B 27/20* (2013.01);
(Continued)

(58) Field of Classification Search
None
See application file for complete search history.

(56) References Cited

U.S. PATENT DOCUMENTS 2,593,829 A * 4/1952 Arledter ................ H01G 4/18
361/303
4,675,789 A * 6/1987 Kuwabara ............. H05K 1/116
174/262
(Continued)

FOREIGN PATENT DOCUMENTS

CN      101974205 A *    2/2011
CN      102651278 A *    8/2012 .............. H01G 4/30
(Continued)

OTHER PUBLICATIONS

Machine Translation of JP 2001094265 A, Apr. 2001 (Year: 2001).*
(Continued)

*Primary Examiner* — Jeffrey A Vonch
(74) *Attorney, Agent, or Firm* — Nixon & Vanderhye

(57) ABSTRACT

A multi-layered board includes: a middle conductive layer; a first dielectric layer that is disposed directly on a first surface of the middle conductive layer; a second dielectric layer that is disposed directly on a second surface of the middle conductive layer; a first outer surface conductive layer that is disposed directly on an outer side of the first dielectric layer; and a second outer surface conductive layer that is disposed directly on an outer side of the second dielectric layer. The first outer surface conductive layer serves as a first outer surface of the multi-layered board, and the second outer surface conductive layer serves as a second outer surface of the multi-layered board. The middle conductive layer is solidly formed over an entire planar direction of the multi-layered board. The first dielectric layer and
(Continued)

the second dielectric layer each independently have a thickness variation of 15% or less.

14 Claims, 8 Drawing Sheets

(51) Int. Cl.
    *B32B 27/20*     (2006.01)
    *H05K 3/40*     (2006.01)
    *H05K 3/44*     (2006.01)
    *H05K 3/46*     (2006.01)
    *H05K 1/16*     (2006.01)
    *H01G 4/20*     (2006.01)
    *B32B 7/02*     (2019.01)
    *H05K 1/02*     (2006.01)
    *H05K 1/09*     (2006.01)
    *H05K 3/00*     (2006.01)
    *H05K 3/06*     (2006.01)
    *B32B 3/24*     (2006.01)
    *B32B 27/38*     (2006.01)
    *H05K 3/42*     (2006.01)
    *H05K 1/18*     (2006.01)
    *H01G 4/12*     (2006.01)
    *H01G 4/18*     (2006.01)
    *H01G 2/06*     (2006.01)
    *B32B 3/26*     (2006.01)
    *B32B 27/18*     (2006.01)

(52) U.S. Cl.
CPC .......... *H01G 4/206* (2013.01); *H05K 1/0213* (2013.01); *H05K 1/09* (2013.01); *H05K 1/162* (2013.01); *H05K 3/0047* (2013.01); *H05K 3/06* (2013.01); *H05K 3/4038* (2013.01); *H05K 3/4608* (2013.01); *H05K 3/4644* (2013.01); *B32B 3/266* (2013.01); *B32B 27/18* (2013.01); *B32B 27/38* (2013.01); *B32B 2250/05* (2013.01); *B32B 2250/40* (2013.01); *B32B 2305/30* (2013.01); *B32B 2307/202* (2013.01); *B32B 2307/204* (2013.01); *B32B 2307/212* (2013.01); *B32B 2307/50* (2013.01); *B32B 2307/54* (2013.01); *B32B 2457/08* (2013.01); *B32B 2457/16* (2013.01); *H01G 2/06* (2013.01); *H01G 4/12* (2013.01); *H01G 4/1227* (2013.01); *H01G 4/18* (2013.01); *H05K 1/0231* (2013.01); *H05K 1/185* (2013.01); *H05K 3/429* (2013.01); *H05K 3/445* (2013.01); *H05K 3/4626* (2013.01); *H05K 3/4641* (2013.01); *H05K 3/4652* (2013.01); *H05K 3/4655* (2013.01); *H05K 2201/0137* (2013.01); *H05K 2201/0191* (2013.01); *H05K 2201/0195* (2013.01); *H05K 2201/0203* (2013.01); *H05K 2201/0355* (2013.01); *H05K 2201/09309* (2013.01); *H05K 2201/09509* (2013.01); *Y10S 428/901* (2013.01); *Y10T 29/49155* (2015.01); *Y10T 29/49165* (2015.01); *Y10T 428/12361* (2015.01); *Y10T 428/12431* (2015.01); *Y10T 428/12438* (2015.01); *Y10T 428/12535* (2015.01); *Y10T 428/12542* (2015.01); *Y10T 428/12556* (2015.01); *Y10T 428/12903* (2015.01); *Y10T 428/24322* (2015.01); *Y10T 428/25* (2015.01); *Y10T 428/26* (2015.01); *Y10T 428/266* (2015.01); *Y10T 428/269* (2015.01); *Y10T 428/31678* (2015.04)

(56) References Cited

U.S. PATENT DOCUMENTS

| | | | | |
|---|---|---|---|---|
| 4,996,097 | A * | 2/1991 | Fischer | B32B 15/08 428/220 |
| 5,155,655 | A * | 10/1992 | Howard | H01L 23/642 361/303 |
| 5,168,421 | A * | 12/1992 | Suzuki | H01G 2/12 361/323 |
| 5,509,200 | A * | 4/1996 | Frankeny | H05K 1/112 29/852 |
| 5,604,167 | A * | 2/1997 | Wilson | C04B 35/462 501/138 |
| 5,770,476 | A * | 6/1998 | Stone | H01L 23/49838 257/E23.079 |
| 5,847,327 | A * | 12/1998 | Fischer | H01L 23/49827 174/258 |
| 6,215,649 | B1 * | 4/2001 | Appelt | H05K 1/162 361/301.4 |
| 6,274,224 | B1 * | 8/2001 | O'Bryan | H05K 1/162 428/209 |
| 6,291,779 | B1 * | 9/2001 | Lubert | H05K 3/0094 174/262 |
| 6,467,160 | B1 * | 10/2002 | Cummings | H05K 3/0094 29/831 |
| 6,562,179 | B1 * | 5/2003 | Ikeguchi | H05K 1/0373 156/307.5 |
| 6,613,413 | B1 * | 9/2003 | Japp | H05K 3/38 174/255 |
| 6,657,849 | B1 * | 12/2003 | Andresakis | H05K 1/162 361/311 |
| 8,713,769 | B2 | 5/2014 | Dudnikov | |
| 9,161,447 | B2 | 10/2015 | Dudnikov | |
| 2001/0003605 | A1 * | 6/2001 | Honda | H01G 13/00 427/404 |
| 2001/0036052 | A1 * | 11/2001 | Hartman | H05K 1/162 361/270 |
| 2001/0038906 | A1 * | 11/2001 | O'Bryan | H05K 1/162 428/209 |
| 2002/0048137 | A1 * | 4/2002 | Williams | H05K 1/162 361/302 |
| 2002/0088977 | A1 * | 7/2002 | Mori | H05K 1/162 257/68 |
| 2002/0195270 | A1 * | 12/2002 | Okubora | H05K 1/16 174/260 |
| 2003/0011070 | A1 * | 1/2003 | Iijima | H05K 3/445 257/734 |
| 2003/0011960 | A1 * | 1/2003 | Koning | H01B 3/30 361/311 |
| 2003/0121146 | A1 * | 7/2003 | Schmidt | H05K 1/141 29/846 |
| 2004/0109298 | A1 * | 6/2004 | Hartman | H05K 1/162 361/762 |
| 2004/0118602 | A1 * | 6/2004 | Lee | H05K 1/162 174/260 |
| 2004/0124493 | A1 * | 7/2004 | Chua | H05K 1/162 257/508 |
| 2004/0147658 | A1 * | 7/2004 | Matsushima | C08L 63/00 524/436 |
| 2004/0201367 | A1 * | 10/2004 | Echigo | H05K 1/162 320/166 |
| 2004/0256731 | A1 * | 12/2004 | Mao | C08L 65/00 257/773 |
| 2005/0009975 | A1 * | 1/2005 | Hsu | C08L 63/00 524/430 |
| 2005/0029515 | A1 * | 2/2005 | Nagai | H01G 4/206 257/40 |
| 2005/0108874 | A1 * | 5/2005 | Lee | H05K 1/162 29/849 |
| 2005/0122662 | A1 * | 6/2005 | Hayashi | H01G 4/12 361/306.3 |
| 2005/0128680 | A1 * | 6/2005 | Shin | H01G 4/30 361/306.3 |
| 2005/0161149 | A1 * | 7/2005 | Yokota | C25D 15/02 156/151 |

(56) References Cited

U.S. PATENT DOCUMENTS

| | | | | |
|---|---|---|---|---|
| 2005/0186437 A1* | 8/2005 | Pramanik | ............... | B32B 15/08 |
| | | | | 428/474.4 |
| 2005/0224767 A1* | 10/2005 | Japp | ............... | H05K 1/0373 |
| | | | | 252/570 |
| 2005/0257957 A1* | 11/2005 | Vasoya | ............... | H05K 3/445 |
| | | | | 174/260 |
| 2006/0062976 A1* | 3/2006 | Sohn | ............... | B32B 7/04 |
| | | | | 428/209 |
| 2006/0120014 A1* | 6/2006 | Nakamura | ............... | H01G 9/025 |
| | | | | 361/305 |
| 2006/0133011 A1* | 6/2006 | Cox | ............... | H01L 23/49894 |
| | | | | 361/311 |
| 2006/0143886 A1* | 7/2006 | Srinivasan | ............... | H01G 4/1209 |
| | | | | 29/25.41 |
| 2006/0182973 A1* | 8/2006 | Lee | ............... | C08L 63/00 |
| | | | | 428/413 |
| 2006/0183872 A1* | 8/2006 | Lee | ............... | C08L 63/00 |
| | | | | 525/527 |
| 2006/0185140 A1* | 8/2006 | Andresakis | ............... | H05K 1/167 |
| | | | | 29/25.41 |
| 2006/0203456 A1* | 9/2006 | Sohn | ............... | H05K 3/4652 |
| | | | | 361/748 |
| 2006/0216495 A1* | 9/2006 | Motobe | ............... | H05K 1/0373 |
| | | | | 428/323 |
| 2006/0258327 A1* | 11/2006 | Lee | ............... | H01G 4/206 |
| | | | | 455/352 |
| 2006/0286364 A1* | 12/2006 | Lee | ............... | H01G 4/20 |
| | | | | 428/323 |
| 2007/0004165 A1* | 1/2007 | Shin | ............... | H05K 1/162 |
| | | | | 438/393 |
| 2007/0027246 A1* | 2/2007 | Shin | ............... | H05K 1/162 |
| | | | | 524/432 |
| 2007/0062725 A1* | 3/2007 | Wu | ............... | H05K 1/162 |
| | | | | 174/260 |
| 2007/0087929 A1* | 4/2007 | Park | ............... | H01G 4/206 |
| | | | | 501/100 |
| 2007/0097597 A1* | 5/2007 | Ko | ............... | H01G 4/33 |
| | | | | 361/311 |
| 2007/0116976 A1* | 5/2007 | Tan | ............... | H01G 4/206 |
| | | | | 428/546 |
| 2007/0117898 A1* | 5/2007 | Tan | ............... | H05K 1/162 |
| | | | | 524/413 |
| 2007/0125575 A1* | 6/2007 | Inui | ............... | H01L 23/50 |
| | | | | 174/262 |
| 2007/0148421 A1* | 6/2007 | Sohn | ............... | H05K 1/162 |
| | | | | 428/209 |
| 2007/0151758 A1* | 7/2007 | Dunn | ............... | H05K 1/162 |
| | | | | 174/262 |
| 2007/0164396 A1* | 7/2007 | Jow | ............... | H01G 4/40 |
| | | | | 257/532 |
| 2007/0199195 A1* | 8/2007 | Davis | ............... | H05K 3/445 |
| | | | | 29/830 |
| 2007/0207337 A1* | 9/2007 | Nagatani | ............... | H05K 3/4655 |
| | | | | 428/607 |
| 2008/0100986 A1* | 5/2008 | Sohn | ............... | H05K 1/162 |
| | | | | 361/301.1 |
| 2008/0151518 A1* | 6/2008 | Hsu | ............... | H01L 24/24 |
| | | | | 361/762 |
| 2008/0158777 A1* | 7/2008 | Sohn | ............... | H01G 4/232 |
| | | | | 361/321.1 |
| 2008/0212299 A1* | 9/2008 | Kim | ............... | H05K 1/162 |
| | | | | 361/763 |
| 2008/0216298 A1 | 9/2008 | Dudnikov | | |
| 2008/0217049 A1 | 9/2008 | Dudnikov | | |
| 2008/0223603 A1* | 9/2008 | Kim | ............... | H05K 1/162 |
| | | | | 174/255 |
| 2008/0226815 A1* | 9/2008 | Pramanik | ............... | H01L 21/4857 |
| | | | | 427/79 |
| 2008/0257480 A1* | 10/2008 | Nakamura | ............... | H05K 1/162 |
| | | | | 156/150 |
| 2008/0266750 A1* | 10/2008 | Wu | ............... | H01G 4/06 |
| | | | | 361/313 |
| 2008/0289865 A1* | 11/2008 | Nakamura | ............... | H05K 1/162 |
| | | | | 174/260 |
| 2008/0297274 A1* | 12/2008 | Borland | ............... | H05K 1/162 |
| | | | | 333/172 |
| 2009/0025195 A1* | 1/2009 | Kim | ............... | H05K 1/162 |
| | | | | 29/25.03 |
| 2009/0050355 A1* | 2/2009 | Chun | ............... | H05K 1/162 |
| | | | | 174/257 |
| 2009/0251846 A1* | 10/2009 | Lee | ............... | B82Y 10/00 |
| | | | | 361/301.3 |
| 2009/0273884 A1* | 11/2009 | Shimizu | ............... | H01G 4/232 |
| | | | | 361/306.1 |
| 2010/0060381 A1* | 3/2010 | Das | ............... | H05K 1/0234 |
| | | | | 333/172 |
| 2010/0129604 A1* | 5/2010 | Uchida | ............... | B32B 15/08 |
| | | | | 428/141 |
| 2010/0168307 A1* | 7/2010 | Narishige | ............... | C01G 25/00 |
| | | | | 524/413 |
| 2010/0175914 A1* | 7/2010 | Pramanik | ............... | H01G 4/203 |
| | | | | 174/256 |
| 2010/0202100 A1* | 8/2010 | Koh | ............... | H01G 4/32 |
| | | | | 361/323 |
| 2010/0246089 A1* | 9/2010 | Yano | ............... | H01G 4/0085 |
| | | | | 361/306.1 |
| 2010/0307803 A1* | 12/2010 | Paul | ............... | H05K 3/4676 |
| | | | | 174/257 |
| 2010/0309607 A1* | 12/2010 | Liu | ............... | H05K 1/162 |
| | | | | 361/313 |
| 2010/0321858 A1* | 12/2010 | Hsu | ............... | H01G 4/232 |
| | | | | 361/301.4 |
| 2011/0006393 A1* | 1/2011 | Cui | ............... | H01L 28/40 |
| | | | | 257/532 |
| 2011/0032656 A1* | 2/2011 | Ito | ............... | H01G 4/306 |
| | | | | 361/301.4 |
| 2011/0053759 A1* | 3/2011 | Shimba | ............... | C04B 41/009 |
| | | | | 501/136 |
| 2011/0154657 A1* | 6/2011 | Chuang | ............... | H05K 3/0097 |
| | | | | 29/829 |
| 2012/0063108 A1* | 3/2012 | Kim | ............... | H05K 1/0231 |
| | | | | 361/783 |
| 2012/0152886 A1* | 6/2012 | Kim | ............... | H05K 1/162 |
| | | | | 216/6 |
| 2012/0228014 A1* | 9/2012 | Das | ............... | H05K 3/4608 |
| | | | | 174/260 |
| 2012/0257323 A1* | 10/2012 | Hayakawa | ............... | H01L 23/642 |
| | | | | 361/301.4 |
| 2012/0300416 A1* | 11/2012 | Saji | ............... | H05K 1/0284 |
| | | | | 361/748 |
| 2013/0048350 A1* | 2/2013 | Horiuchi | ............... | H05K 3/4608 |
| | | | | 174/255 |
| 2013/0177739 A1* | 7/2013 | Syoujiguchi | ............... | H05K 3/022 |
| | | | | 428/143 |
| 2013/0221485 A1* | 8/2013 | Kim | ............... | H01L 28/40 |
| | | | | 257/532 |
| 2013/0299218 A1* | 11/2013 | Inagaki | ............... | H01L 23/49822 |
| | | | | 174/257 |
| 2015/0294793 A1* | 10/2015 | Ghosh | ............... | H01G 4/206 |
| | | | | 428/141 |
| 2015/0302990 A1* | 10/2015 | Ghosh | ............... | H01G 4/33 |
| | | | | 428/141 |
| 2015/0305150 A1* | 10/2015 | Ohata | ............... | H05K 1/0353 |
| | | | | 428/201 |
| 2016/0330839 A1* | 11/2016 | Kuwako | ............... | H05K 3/4602 |
| 2017/0372839 A1* | 12/2017 | Weir | ............... | H01G 4/1227 |
| 2018/0146550 A1* | 5/2018 | Maier | ............... | H05K 1/05 |
| 2018/0263145 A1* | 9/2018 | Tanaka | ............... | B32B 7/12 |
| 2018/0315547 A1* | 11/2018 | Weir | ............... | H01G 4/12 |
| 2018/0332721 A1* | 11/2018 | Shimizu | ............... | H05K 1/0298 |

FOREIGN PATENT DOCUMENTS

| | | | | |
|---|---|---|---|---|
| CN | 103289322 A | * | 9/2013 | |
| CN | 103298274 A | * | 9/2013 | |
| GB | 690328 A | * | 4/1953 | ............... H05K 3/06 |
| JP | 04144187 A | * | 5/1992 | ............... H05K 1/162 |
| JP | 11207870 A | * | 8/1999 | |

(56) References Cited

FOREIGN PATENT DOCUMENTS

| | | | | | |
|---|---|---|---|---|---|
| JP | 2000133947 | A | * | 5/2000 | |
| JP | 2000244130 | A | * | 9/2000 | |
| JP | 2001094265 | A | * | 4/2001 | |
| JP | 2001192536 | A | * | 7/2001 | |
| JP | 2001347600 | A | * | 12/2001 | |
| JP | 2002117738 | A | * | 4/2002 | ............ H05K 1/162 |
| JP | 2003011270 | A | * | 1/2003 | |
| JP | 2003318510 | A | * | 11/2003 | |
| JP | 2004134421 | A | * | 4/2004 | |
| JP | 2005005458 | A | * | 1/2005 | |
| JP | 2005019883 | A | * | 1/2005 | |
| JP | 2005064316 | A | * | 3/2005 | |
| JP | 2005072166 | A | * | 3/2005 | |
| JP | 2005187914 | A | * | 7/2005 | |
| JP | 2006032510 | A | * | 2/2006 | |
| JP | 2006165400 | A | * | 6/2006 | |
| JP | 2006-210536 | | | 8/2006 | |
| JP | 2006229097 | A | * | 8/2006 | |
| JP | 2007027101 | A | * | 2/2007 | |
| JP | 2007-184386 | | | 7/2007 | |
| JP | 2007184386 | A | * | 7/2007 | |
| JP | 2008227153 | A | * | 9/2008 | |
| JP | 2009-004457 | | | 1/2009 | |
| JP | 2009-043769 | | | 2/2009 | |
| JP | 2010-521074 | | | 6/2010 | |
| JP | 2012227240 | A | * | 11/2012 | |
| JP | 2014123703 | A | * | 7/2014 | |
| KR | 20040036779 | A | * | 5/2004 | |
| KR | 100631994 | B1 | * | 9/2006 | |
| KR | 100849410 | B1 | * | 7/2008 | |
| WO | WO-9402310 | A1 | * | 2/1994 | ............ H05K 1/162 |
| WO | WO-03011589 | A1 | * | 2/2003 | ............... H01G 4/18 |
| WO | WO-2010065973 | A1 | * | 6/2010 | ............ H05K 1/162 |

OTHER PUBLICATIONS

Machine Translation of JP 2005-187914 A, Jul. 2005 (Year: 2005).*
Machine Translation of WO 2010065973 A1, Jun. 2010 (Year: 2010).*
Wada et al., Size Dependence of Dielectric Properties for nm-Sized Barium Titanate Crystallites and Its Origin, Jan. 2005, Journal of the Korean Physical Society, vol. 46, No. 1, pp. 303-307 (Year: 2005).*
Machine Translation of JP-2008227153-A, Sep. 2008 (Year: 2008).*
Machine Translation of CN-102651278-A, Aug. 2012 (Year: 2012).*
Upadhyay et al., Characterization, dielectric and electrical behaviour of BaTiO3 nanoparticles prepared via titanium(IV) triethanolaminato isopropoxide and hydrated barium hydroxide, Jun. 2014, Bulletin of Materials Science, vol. 37, pp. 481-489 (Year: 2014).*
International Search Report, PCT/JP2017/003966, dated Apr. 25, 2017.

* cited by examiner

Fig.7 (a)
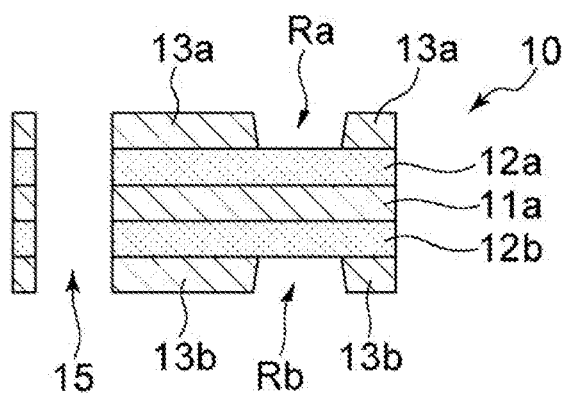
(b)
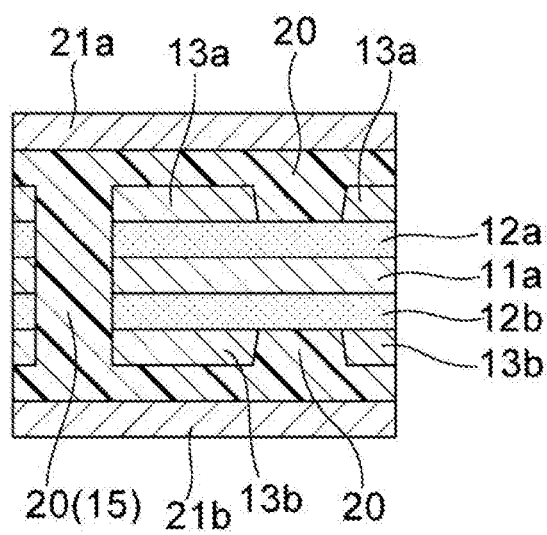
(c)
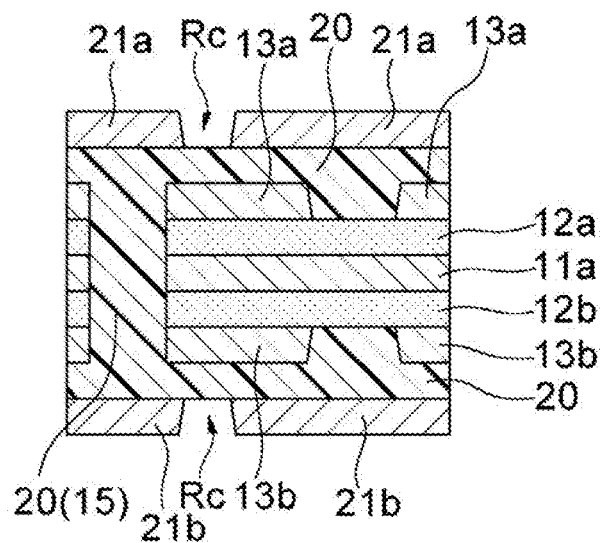

Fig.8
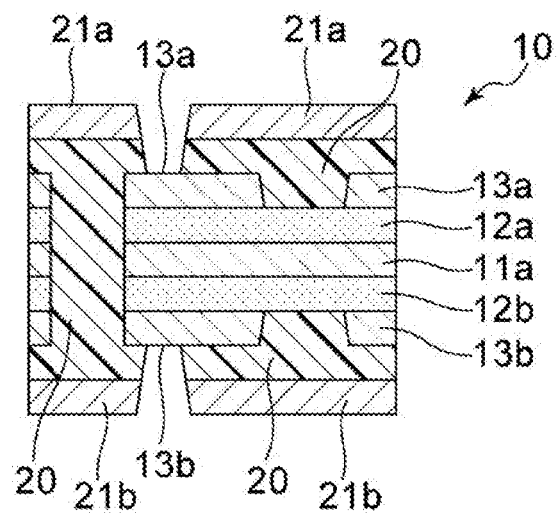
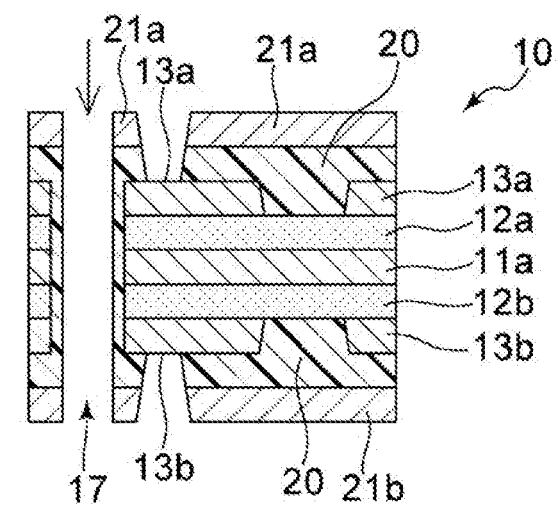
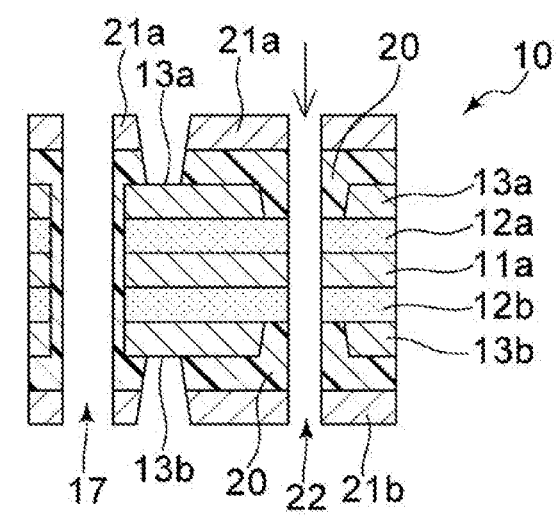

Fig.9 (a)
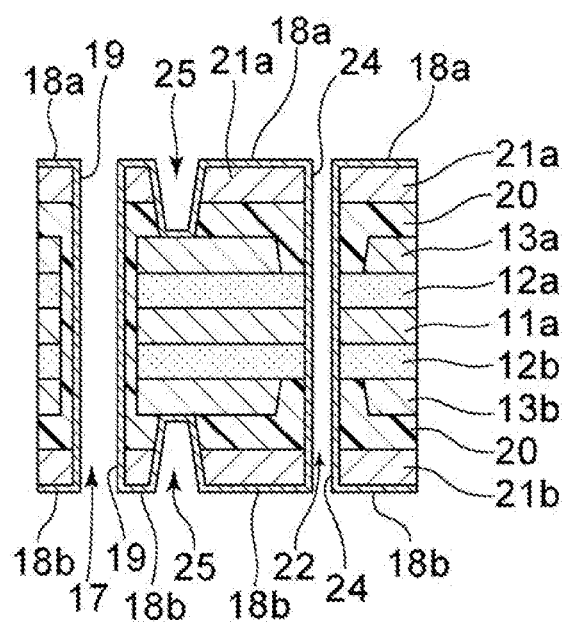
(b)
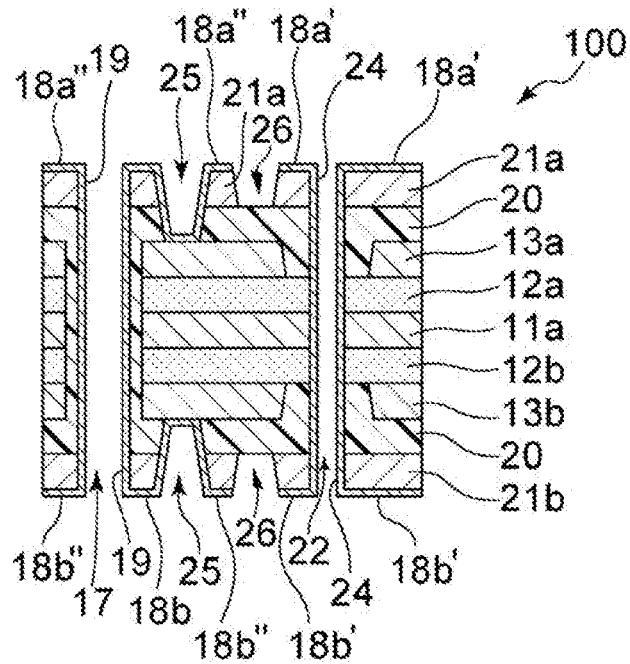

MULTILAYER LAMINATE AND METHOD FOR PRODUCING MULTILAYER PRINTED WIRING BOARD USING SAME

TECHNICAL FIELD

The present invention relates to a multi-layered board. The present invention also relates to a method for producing a multi-layer printed wiring board that uses the multi-layered board.

BACKGROUND ART

A technique is known in which a capacitor structure is formed in an inner layer portion of a printed wiring board, in particular, a multi-layer printed wiring board, using the same method as a method for forming a circuit configuration by using a copper-clad stacked board, and the formed capacitor structure is used as an embedded capacitor. By forming the capacitor structure in the inner layer portion of the multi-layer printed wiring board, it is possible to omit a capacitor provided on an outer layer surface, and thus a finer and denser outer layer circuit can be formed. As a result, the number of surface mount components can be reduced, which facilitates the production of a printed wiring board that includes a fine pitch circuit.

As an example of a multi-layer printed wiring board that includes an embedded capacitor as described above, for example, as disclosed in Patent Literature 1, a seven-layer structure capacitive stack is known in which conductive layers and dielectric layers are alternately disposed. Referring to the cross-sectional structure shown in FIGS. 6 to 9 of Patent Literature 1, in the capacitive stack, in particular, circuit patterns are formed in the conductive layers, and conductive via holes are formed in portions where the circuit patterns are not formed. Based on this configuration, it is considered that the capacitive stack is produced by repeating a process of forming a circuit pattern on a conductive layer, then, forming a dielectric layer on the circuit pattern, forming a conductive layer on the dielectric layer, and forming a dielectric layer on the conductive layer.

CITATION LIST

Patent Literature

Patent Literature 1: JP 2010-521074 A

SUMMARY OF INVENTION

Due to the fact that the capacitive stack disclosed in Patent Literature 1 is produced in the manner described above, more specifically, a dielectric layer is formed on a conductive layer on which a circuit pattern has been formed, it is not easy to make the thickness of the dielectric layer constant. In other words, it is not easy to make the electrostatic capacity of the dielectric layer constant. Also, the capacitive stack disclosed in Patent Literature 1 has a seven-layer structure in total including four conductive layers. Due to this layer structure, it is not easy to connect the conductive layers that are located inside the capacitive stack to the conductive layers that are exposed to the outside.

Accordingly, it is an object of the present invention to improve a multi-layered board that incorporates a capacitor, and more specifically, to provide a multi-layered board, wherein a variation in the electrostatic capacity of the capacitor is small.

BRIEF DESCRIPTION OF DRAWINGS

FIGS. 7(a) to 7(c) are schematic diagrams showing another sequence of steps of producing a multi-layer printed wiring board, which is performed after FIG. 3(a).

FIGS. 8(a) to 8(c) are schematic diagrams showing a sequence of steps of producing a multi-layer printed wiring board, which is performed after FIG. 7(c).

FIGS. 9(a) and 9(b) are schematic diagrams showing a sequence of steps of producing a multi-layer printed wiring board, which is performed after FIG. 8(c).

DESCRIPTION OF EMBODIMENTS

Figure 1:
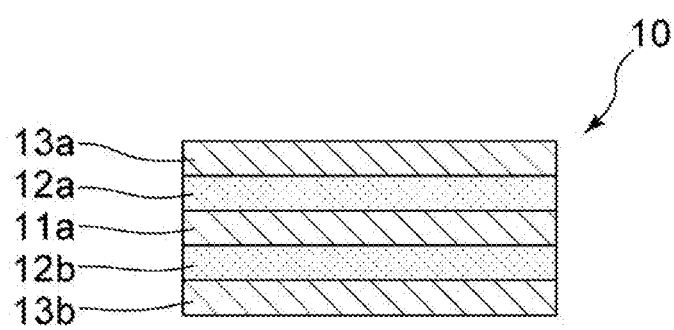
FIG. 1 is a cross-sectional view schematically showing a structure of a multi-layered board according to the present invention, taken along a thickness direction of the multi-layered board.

Hereinafter, the present invention will be described by way of a preferred embodiment with reference to the drawings. FIG. 1 schematically shows a cross-sectional structure taken along a thickness direction of a multi-layered board 10 according to one embodiment of the present invention. As shown in the figure, the multi-layered board 10 has a five-layer structure. To be specific, the multi-layered board 10 includes a middle conductive layer 11a in the middle in the thickness direction of the multi-layered board 10. A first dielectric layer 12a is provided on a first surface of the middle conductive layer 11a, and a second dielectric layer 12b is provided on a second surface of the middle conductive layer 11a. The first dielectric layer 12a is disposed directly on the first surface of the middle conductive layer 11a, and the second dielectric layer 12b is disposed directly on the second surface of the middle conductive layer 11a. In other words, there is no layer between the middle conductive layer 11a and the first dielectric layer 12a. Likewise, there is no layer between the middle conductive layer 11a and the second dielectric layer 12b.

A first outer surface conductive layer 13a is provided on an outer side surface of the first dielectric layer 12a, or in other words, the one surface of the two main surfaces of the first dielectric layer 12a that does not oppose the middle conductive layer 11a. Likewise, a second outer surface conductive layer 13b is provided on an outer side surface of the second dielectric layer 12b. The first outer surface conductive layer 13a is disposed directly on the outer side surface of the first dielectric layer 12a. In other words, there is no layer between the first outer surface conductive layer 13a and the first dielectric layer 12a. Likewise, the second outer surface conductive layer 13b is disposed directly on the outer side surface of the second dielectric layer 12b, and thus there is no layer between the second outer surface conductive layer 13b and the second dielectric layer 12b.

In the multi-layered board 10, the first outer surface conductive layer 13a serves as a first surface of the multi-layered board 10, and the second outer surface conductive layer 13b serves as a second surface of the multi-layered board 10. In other words, no layer is stacked on an outer surface of the first outer surface conductive layer 13a, or in other words, the one surface of the two main surfaces of the second outer surface conductive layer 13b that does not oppose the first dielectric layer 12a. Likewise, no layer is stacked on an outer surface of the second outer surface conductive layer 13b, or in other words, the one of the two main surfaces of the first outer surface conductive layer 13b that does not oppose the second dielectric layer 12b. Because the multi-layered board 10 is configured as described above, the multi-layered board 10 as a whole has a five-layer structure as described above.

It is preferable that the first dielectric layer 12a of the multi-layered board 10 is made of the same material throughout the dielectric layer 12a. The same applies to the second dielectric layer 12b. However, in some cases, each of the dielectric layers 12a and 12b may be configured to include an arbitrarily defined first region and an arbitrarily defined second region which is different from the first region as viewed in planar view of the dielectric layers 12a and 12b, and a constituent material of the first region may be different from a constituent material of the second region. Also, in the case where the first dielectric layer 12a is made of the same material throughout the dielectric layer 12a, and the second dielectric layer 12b is made of the same material throughout the second dielectric layer 12b, the constituent materials of the first dielectric layer 12a and the second dielectric layer 12b may be the same or different.

The same applies to the first outer surface conductive layer 13a and the second outer surface conductive layer 13b. It is preferable that the first outer surface conductive layer 13a is made of the same material throughout the first outer surface conductive layer 13a, and the second outer surface conductive layer 13b is made of the same material throughout the second outer surface conductive layer 13b. However, in some cases, each of the conductive layers 13a and 13b may be configured to include an arbitrarily defined first region and an arbitrarily defined second region which is different from the first region as viewed in planar view of the conductive layers 13a and 13b, and a constituent material of the first region may be different from a constituent material of the second region. Also, in the case where the first outer surface conductive layer 13a is made of the same material throughout the first outer surface conductive layer 13a, and the second outer surface conductive layer 13b is made of the same material throughout the second outer surface conductive layer 13b, the constituent materials of the first outer surface conductive layer 13a and the second outer surface conductive layer 13b may be the same or different.

As shown in FIG. 1, in the multi-layered board 10, the middle conductive layer 11a located in a middle region in the thickness direction is "solidly" formed over an entire planar direction of the multi-layered board 10. In other words, the middle conductive layer 11a does not include, anywhere, a void portion such as a cutout or an aperture (through hole) that extends through the entire middle conductive layer 11a in the thickness direction as viewed in planar view. Because there is no void portion that extends through the entire middle conductive layer 11a in the thickness direction, it is possible to, when forming the first dielectric layer 12a and the second dielectric layer 12b on the surfaces of the middle conductive layer 11a, form the dielectric layers 12a and 12b such that the dielectric layers 12a and 12b have a uniform thickness. As a result, it is possible to effectively suppress the occurrence of a variation in the electrostatic capacities of the dielectric layers 12a and 12b. The degree of thickness variation is measured using a method described later.

In contrast to the above, for example, according to the technique disclosed in Patent Literature 1, a circuit pattern is formed on a conductive layer, that is, there is a void portion that extends through the entire conductive layer in the thickness direction. Accordingly, when a dielectric layer is formed on the conductive layer, the dielectric layer may have different thicknesses in the void portion and the non-void portion, which is likely to cause a variation in the electrostatic capacity of the dielectric layer.

Figure 2:
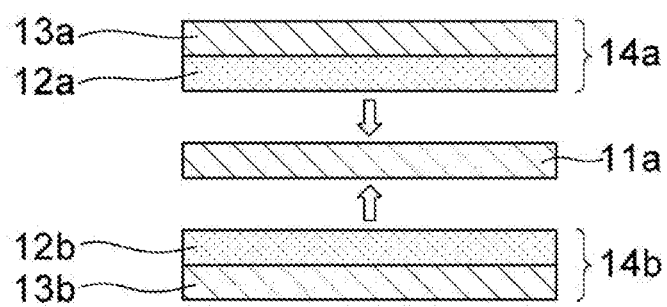
FIG. 2 is a schematic diagram showing a process of producing the multi-layered board shown in FIG. 1.

In order to make it less likely that there is a variation in the electrostatic capacity of each of the dielectric layers 12a and 12b in the multi-layered board 10 according to the present embodiment, it is advantageous to make the thickness of each of the dielectric layers 12a and 12b as uniform as possible. From this viewpoint, it is preferable that the multi-layered board 10 is produced using a method as shown in FIG. 2. To be specific, first, a middle conductive layer 11a is prepared. At the same time, a first element 14a and a second element 14b are prepared. The first element 14a is an element obtained by forming a first dielectric layer 12a on one surface of a first outer surface conductive layer 13a. The second element 14b is an element obtained by forming a second dielectric layer 12b on one surface of a second outer surface conductive layer 13b. Then, the first element 14a and the second element 14b are respectively placed on opposing surfaces of the middle conductive layer 11a, and then stacked together. When being stacked together, the elements 14a and 14b are placed such that the first dielectric layer 12a of the first element 14a opposes the middle conductive layer 11a, and the second dielectric layer 12b of the second element 14b opposes the middle conductive layer 11a.

As shown in FIG. 2, after the middle conductive layer 11a, and the first element 14a and the second element 14b have been placed and stacked together, in this state, the middle conductive layer 11a, the first element 14a, and the second element 14b are pressed under heat. As a result of this operation, the first element 14a and the second element 14b are press-attached to the surfaces of the middle conductive layer 11a, and a multi-layered board 10 is obtained in which the middle conductive layer 11a, the first element 14a, and the second element 14b are integrated together. According to this method, the multi-layered board 10 can be obtained by simply performing a simple operation of attaching the first element 14a and the second element 14b, which have been produced in advance, to the surfaces of the middle conductive layer 11a, and thus a thickness variation is unlikely to occur in each of the first dielectric layer 12a and the second dielectric layer 12b. As a result, an electrostatic capacity variation is unlikely to occur in each of the first dielectric layer 12a and the second dielectric layer 12b.

The first element 14a and the second element 14b are preferably produced by placing a resin composition, which contains dielectric particles and a resin, onto one surface of each of the first outer surface conductive layer 13a and the second outer surface conductive layer 13b so as to form the first dielectric layer 12a and the second dielectric layer 12b from this resin composition. In order to place the resin composition onto one surface of each of the first outer surface conductive layer 13a and the second outer surface conductive layer 13b, for example, the resin composition may be applied. For example, in the case where a thermosetting resin is used as the resin, a resin composition that contains an A-stage thermosetting resin and dielectric particles and that is in a fluidized state like that of varnish may be applied. Then, by curing the applied resin composition by applying heat or energy rays, the thermosetting resin is brought into a B stage, and the first element 14a and the second element 14b are obtained. By producing the first element 14a and the second element 14b using the method described above, it is possible to conveniently form a first dielectric layer 12a and a second dielectric layer 12b that each have a uniform thickness.

As the resin contained in the first dielectric layer 12a and the second dielectric layer 12b, as described above, it is preferable to use a thermosetting resin. In particular, it is preferable to use a resin that is highly insulative. As the thermosetting resin, it is possible to use any thermosetting resin that is conventionally used in the technical field of printed wiring boards. Examples of the thermosetting resin include epoxy resin, polyimide resin, polyamide resin, polyphenylene ether resin, cyanate resin, maleimide resin, phenol resin, phenoxy resin, styrene-butadiene resin, and the like. The thermosetting resin is preferably in an A stage or B stage in the first element 14a and the second element 14b, and is preferably in a C stage in the multi-layered board 10.

For reinforcing the first dielectric layer 12a and the second dielectric layer 12b, the first dielectric layer 12a and the second dielectric layer 12b may contain a reinforcing material such as; a fibrous material including a glass woven fabric, glass non-woven fabric or paper; or a film-like material made of, for example, polyimide resin or the like. But it is preferable that the first dielectric layer 12a and the second dielectric layer 12b do not contain the reinforcing material. A reinforcing material is useful from the viewpoint of imparting strength to the dielectric layers 12a and 12b. However, there is a disadvantage in that the use of a reinforcing material increases the thickness of the dielectric layers 12a and 12b. An increase in the thickness of the dielectric layers 12a and 12b causes a reduction in the electrostatic capacity of the capacitor. For this reason, it is preferable that the dielectric layers 12a and 12b do not contain a reinforcing material so as to prioritize reducing the thickness of the multi-layered board 10 and increasing the capacity of the embedded capacitor over improving the strength of the dielectric layers 12a and 12b. The disadvantage caused by a reduction in the strength of the dielectric layers 12a and 12b can be overcome by attaching the dielectric layers 12a and 12b, which are in the form of elements 14a and 14b, to the middle conductive layer 11a.

The following method can be used as another method for producing a multi-layered board 10. A middle conductive layer 11a, and metal foils that serve as the first outer surface conductive layer 13a and the second outer surface conductive layer 13b are prepared, and at the same time, two dielectric resin layers that serve as the first dielectric layer 12a and the second dielectric layer 12b are prepared. Then, the one dielectric resin layer is placed between the middle conductive layer 11a and the first outer surface conductive layer 13a, and the other dielectric resin layer is placed between the middle conductive layer 11a and the second outer surface conductive layer 13b, and thereafter these are stacked together. In this state, the resulting stack is heated and pressed so as to integrate them together. In this way, a multi-layered board 10 is obtained. The dielectric resin layers used in this method are the dielectric resin layers in which dielectric particles are dispersed in a B-stage thermosetting resin.

The dielectric resin layers may each be configured from a sheet or a film that contains a thermosetting resin and dielectric particles. In some cases, the dielectric resin layers may each be a laminated sheet or a laminated film. The laminated sheet and the laminated film include more than one member that contains a fibrous material impregnated with a thermosetting resin in a B-stage. The fibrous material includes a glass woven fabric, glass non-woven fabric and paper. It is also possible to use a film instead of the fibrous material. Also, the dielectric resin layer may contain, in addition to these materials, an inorganic filler. Irrespective of the configuration of the dielectric resin layers, as the thermosetting resin, it is possible to use, for example, epoxy resin, cyanate resin, maleimide resin, polyphenylene ether resin, phenol resin, polyimide resin, or the like.

The first dielectric layer 12a and the second dielectric layer 12b preferably have a relative dielectric constant of 10 or more, more preferably 20 or more, and even more preferably 40 or more. With a relative dielectric constant greater than or equal to the above values, it is possible to easily increase the electrostatic capacity while reducing the thickness of the dielectric layers 12a and 12b. The higher the relative dielectric constant of the dielectric layers 12a and 12b, the more preferable it is. However, considering the adhesiveness to the middle conductive layer 11a, and to the first outer surface conductive layer 13a and to the second outer surface conductive layer 13b, as well as the strength of the dielectric layers 12a and 12b, the first dielectric layer 12a and the second dielectric layer 12b preferably have a relative dielectric constant of 300 or less, more preferably 200 or less, and even more preferably 100 or less. As used herein, the term "relative dielectric constant" refers to a value obtained through measurement using a split post dielectric resonator method (measurement frequency: 1 GHz).

As a means for satisfying the relative dielectric constant described above, the first dielectric layer 12a and the second dielectric layer 12b preferably contain dielectric particles described above. As the dielectric particles, it is preferable to use dielectric particles that have a relative dielectric constant of 50 or more and 20000 or less. The dielectric particles are preferably made of, for example, a complex oxide that has a perovskite structure such as a barium titanate ceramic, a calcium titanate ceramic, a magnesium titanate ceramic, a bismuth titanate ceramic, a strontium titanate ceramic, a lead zirconate ceramic, a barium zirconate ceramic, or a calcium zirconate ceramic. Among the complex oxides with a perovskite structure, it is preferable to use a barium titanate ceramic so as to obtain a high dielectric constant, but a complex oxide can be selected according to the quality of design of the multi-layered board 10.

The dielectric particles preferably have a particle size of 0.01 μm or more and 1.0 μm or less from the viewpoint of keeping the dielectric constant of the dielectric layer 11 at a constant level throughout the dielectric layer 11. As used herein, the term "particle size" refers to a volume cumulative particle size $D_{50}$ at 50% cumulative volume obtained using a laser diffraction/scattering particle size distribution measurement method.

The first dielectric layer 12a and the second dielectric layer 12b each independently contain dielectric particles in a proportion of preferably 60 mass % or more and 95 mass % or less, more preferably 60 mass % or more and 90 mass % or less, and even more preferably 70 mass % or more and 90 mass % or less from the viewpoint of a balance between improving the electrostatic capacity and the strength of the dielectric layers 12a and 12b. The proportion of dielectric particles contained in each of the dielectric layers 12a and 12b can be obtained from the mass of remaining particles after the resin contained in the dielectric layer 12a or 12b has been sublimated.

In general, a dielectric layer that does not contain a reinforcing material and that has been filled with dielectric particles at a high concentration is very brittle. Accordingly, if a high level of stress is applied during stacking, the dielectric layer may not be able to withstand the stress and may crack. In contrast, with the production method according to the present invention, stacking can be performed without damaging the dielectric layers.

It is preferable to use strain energy at break as a physical property value that indicates the brittleness. Strain energy at break U (unit: MJ (mega joule)) is calculated by using the following integral equation in a stress σ-strain ε curve in a tensile test of a resin film for forming a dielectric layer, where εb is strain at breakage.

$$U = \int_0^{\varepsilon_b} \sigma \varepsilon d\varepsilon \qquad \text{[Math. 1]}$$

When the dielectric layer filled with dielectric particles at a high concentration has a strain energy at break of 1.8 MJ or less, the effect of suppressing damage to the dielectric layer and the effect of suppressing a thickness variation, which are advantageous effects of the production method according to the present invention, are exhibited significantly. The strain energy at break U of the dielectric layer is typically 1.2 MJ or less, more typically 0.8 MJ or less, and even more typically 0.5 MJ or less. There is no particular limitation on the lower limit value of the strain energy at break U, but the lower limit value of the strain energy at break U is preferably 0.01 MJ or more, and more preferably 0.02 MJ or more. With a lower limit value within the range described above, the uniformity of thickness of the dielectric layers 12a and 12b in the multi-layered board according to the present invention can be sufficiently ensured. It is preferable that either one of the dielectric layers 12a and 12b in the multi-layered board according to the present invention satisfies the value of the strain energy at break U, and it is more preferable that both of the dielectric layers 12a and 12b satisfy the value of the strain energy at break U.

In general, a dielectric layer that has a low strain energy at break has a low tensile strength. A dielectric layer that exhibits a relative dielectric constant typically has a tensile strength of 60.0 MPa or less, more typically 55.0 MPa or less, and even more typically 50.0 MPa or less. In this case, the advantageous effects of the present invention are more advantageously exhibited.

On the other hand, from the viewpoint of sufficiently ensuring the adhesiveness between a dielectric layer and a conductive layer, the dielectric layer preferably has a tensile strength of 5.0 MPa or more, and more preferably 8.0 MPa or more.

It is preferable that either one of the dielectric layers 12a and 12b in the multi-layered board according to the present invention satisfies the value of the tensile strength, and it is more preferable that both of the dielectric layers 12a and 12b satisfy the value of the tensile strength.

Also, when the dielectric layer has a tensile elongation at break (strain at break) as low as 5.0% or less, or 4.0% or less, or 1.0% or less, the advantageous effects of the present invention are more advantageously exhibited.

On the other hand, from the viewpoint of retaining flexibility sufficient to withstand at least handling during production of a printed wiring board, the dielectric layer preferably has a tensile elongation at break (strain at break) of 0.05% or more, and more preferably 0.2% or more.

It is preferable that either one of the dielectric layers 12a and 12b in the multi-layered board according to the present invention satisfies the value of the tensile elongation at break, and it is more preferable that both of the dielectric layers 12a and 12b satisfy the value of the tensile elongation at break.

With respect to the strain energy at break, the tensile strength, and the tensile elongation at break described above, values obtained from stress strain curves obtained through measurement in accordance with JIS K 7161 (1994) "Test Method for Tensile Properties of Plastics" at a measurement temperature of 25° C., a chuck-to-chuck distance of 50 mm, and a pulling speed of 1.0 mm/min (2%/min in terms of strain speed) are used as standard conditions. In a case where a sample of the dielectric layer is too short for the chuck-to-chuck distance, measurement may be performed with a method that uses a strain speed of 2%/min.

Indentation elastic modulus Eit may be used as another physical property value that indicates the brittleness of the dielectric layer. The dielectric layer typically has an indentation elastic modulus Eit as high as 4800 N/mm$^2$ or more, more typically 6000 N/mm$^2$ or more, and even more typically 8000 N/mm$^2$ or more. As the indentation elastic modulus Eit, a value obtained through measurement using a nanoindentation method in accordance with ISO 14577 (2015) is used. It is preferable that either one of the dielectric layers 12a and 12b in the multi-layered board according to the present invention satisfies the value of the indentation elastic modulus Eit, and it is more preferable that both of the dielectric layers 12a and 12b satisfy the value of the indentation elastic modulus Eit.

As the thickness of each of the first dielectric layer 12a and the second dielectric layer 12b is reduced, the electric capacity increases, and the amount of electric power stored increases as well. The stored electric power is used as a part of power supply, which leads to power saving. The thickness of each of the dielectric layers 12a and 12b is determined at the time of product design and circuit design, and is determined considering the level required by the market. In the present invention, the first dielectric layer 12a and the second dielectric layer 12b each independently have a thickness of preferably 30 μm or less, more preferably 16 μm or less, even more preferably 12 μm or less, and most preferably 8 μm or less. There is no limitation on the lower limit of the thickness of each of the dielectric layers 12a and 12b as long as adjacent conductive layers do not short circuit. For example, the first dielectric layer 12a and the second dielectric layer 12b each independently have a thickness of, preferably 0.1 μm or more, and more preferably 0.5 μm or more from the viewpoint of more reliably preventing a short circuit between adjacent conductive layers as described above.

Under the condition that the first dielectric layer 12a and the second dielectric layer 12b each have a thickness within the above-described range, it is preferable that there is little variation between thicknesses measured at a plurality of arbitrary positions. With little thickness variation, a variation is unlikely to occur in the electrostatic capacity of the capacitor formed from the dielectric layers 12a and 12b. From this viewpoint, the dielectric layers 12a and 12b each independently have a thickness variation of, preferably 15% or less, more preferably 10% or less, and even more preferably 8% or less.

The thickness variation of the dielectric layers 12a and 12b is a value defined by the greater one of numerical values (unit: %) that are represented by the following expressions (1) and (2) after the highest, lowest, and average values are obtained by performing measurement at at least a total of ten spots on the first dielectric layer 12a or the second dielectric layer 12b including the center and edges (four corners if the dielectric layer is, for example, rectangular) by observing a cross section in the thickness direction that has been enlarged (for example, at a magnification of 500 times or more):

[100×(highest value−average value)/average value] (1); and

[100×(average value−lowest value)/average value] (2).

As described above, the first dielectric layer 12a and the second dielectric layer 12b each have little thickness variation. The first dielectric layer 12a and the second dielectric layer 12b may have the same thickness, or may have different thicknesses. In either case, it is preferable that the difference between the relative dielectric constant of the first dielectric layer 12a and the relative dielectric constant of the second dielectric layer 12b is small. In particular, the difference between the relative dielectric constant $\varepsilon a$ of the first dielectric layer 12a and the relative dielectric constant $\varepsilon b$ of the second dielectric layer 12b is preferably 10% or less, more preferably 5% or less, and even more preferably 3% or less. With a small difference between the relative dielectric constant $\varepsilon a$ of the first dielectric layer 12a and the relative dielectric constant $\varepsilon b$ of the second dielectric layer 12b, it becomes easier to design the production of a multi-layer printed wiring board, by using the multi-layered board 10. From this viewpoint, it is particularly preferable that the first dielectric layer 12a and the second dielectric layer 12b have the same thickness. It is particularly preferable that the first dielectric layer 12a and the second dielectric layer 12b have the same composition (the composition of the resin composition). The difference between the relative dielectric constant $\varepsilon a$ of the first dielectric layer 12a and the relative dielectric constant $\varepsilon b$ of the second dielectric layer 12b is defined by $[(|\varepsilon a-\varepsilon b|/\varepsilon a)\times 100]$.

There is no particular limitation on the thicknesses of the middle conductive layer 11a, the first outer surface conductive layer 13a and the second outer surface conductive layer 13b that sandwich the first dielectric layer 12a and the second dielectric layer 12b. These layers may be thin or thick. It is preferable that the conductive layers 11a, 13a, and 13b each independently have a thickness of, for example, 0.1 µm or more and 70 µm or less. The conductive layers 11a, 13a, and 13b may have the same thickness and/or may be of the same type, or may have different thicknesses and/or may be of different types. In general, the conductive layers 11a, 13a, and 13b are preferably made of metal foils from the viewpoint of production processes. The metal foils may be rolled foils, electrolytic foils, or vapor deposition foils. As the metal foils, for example, copper foils are typically used, but it is also possible to use metal foils other than copper foils. Also, an electric resistance layer (for example, a layer made of Ni—P, Ni—Cr or the like) may be provided on the surface, which oppose the corresponding dielectric layer 12, of the conductive layers 13a and 13b.

From the viewpoint of sufficiently ensuring the thickness of each of the first dielectric layer 12a and the second dielectric layer 12b and obtaining a sufficiently high electrostatic capacity, it is preferable that the surfaces, which oppose the dielectric layers 12a or 12b, of the conductive layers 11a, 13a, and 13b have a low roughness. From this viewpoint, the surfaces, which oppose the first dielectric layer 12a or the second dielectric layer 12b, of the conductive layers 11a, 13a, and 13b preferably have a surface roughness Rz of 1.5 µm or less, more preferably 1.0 µm or less, and even more preferably they are not roughened, the surface roughness Rz being a ten-point average roughness Rz (JIS B0601-1994). With this configuration, the thicknesses of the first dielectric layer 12a and the second dielectric layer 12b can be easily made more uniform. In particular, with respect to the middle conductive layer 11a, the difference in surface roughness Rz between two surfaces of the middle conductive layer 11a is preferably 1.0 µm or less, and more preferably 0.5 µm or less. Because the two surfaces of the middle conductive layer 11a oppose the dielectric layers 12a and 12b, respectively, by reducing the difference in roughness between the two surfaces of the middle conductive layer 11a, the thicknesses of the first dielectric layer 12a and the second dielectric layer 12b can be made more uniform.

The multi-layered board 10 configured as described above is preferably used as a material for producing a multi-layer printed wiring board. Accordingly, hereinafter, a preferred method for producing a multi-layer printed wiring board using the multi-layered board 10 will be described.

Figure 3:
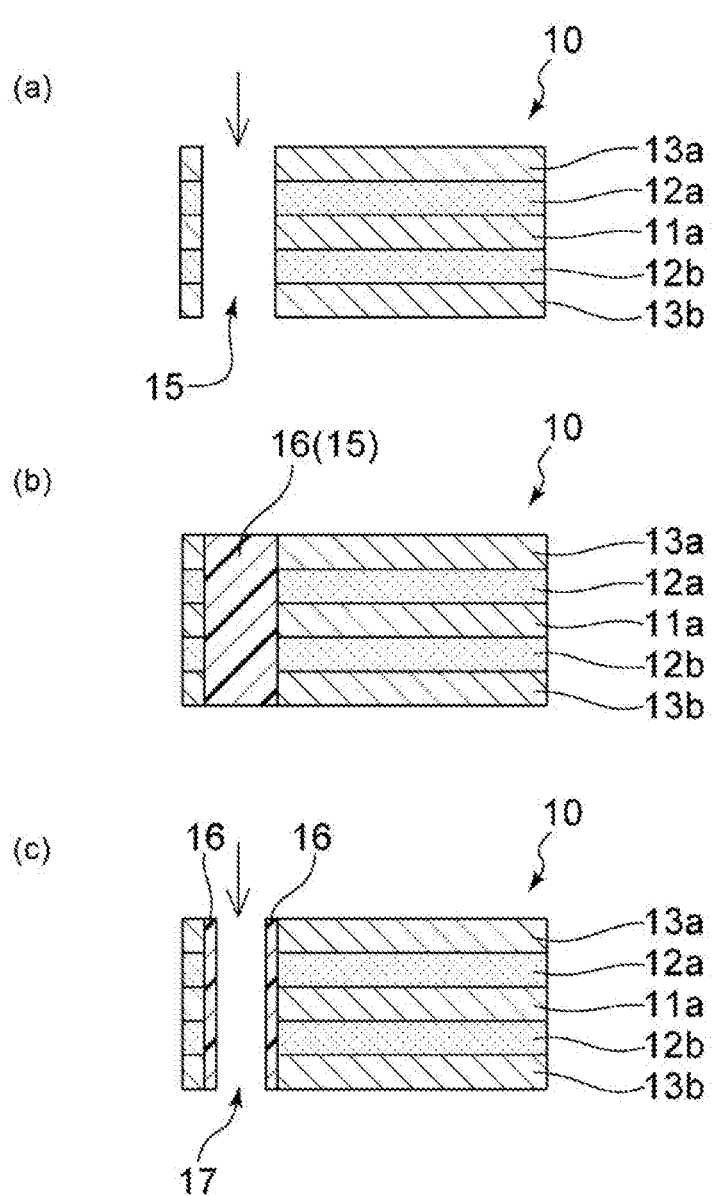
FIGS. 3(a) to 3(c) are schematic diagrams showing a sequence of steps of producing a multi-layer printed wiring board by using the multi-layered board shown in FIG. 1.

First, as shown in FIG. 3(a), a first through hole 15 that extends through the entire multi-layered board 10 in the thickness direction thereof is formed at a predetermined position in the multi-layered board 10. The first through hole 15 can be formed by appropriately using a drilling means known in the technical field of the invention such as, for example, a drill. For the diameter of the first through hole, an appropriate value is selected according to the intended specific application of the multi-layer printed wiring board.

Next, as shown in FIG. 3(b), the first through hole 15 formed through drilling is filled with a filler 16. A non-electroconductive material is preferably used as the filler 16. As used herein, the term "non-electroconductive material" refers to a material that has a volume resistivity at 25° C. of $1\times 10^7$ Ω·cm or more. It is convenient to use a resin as the non-electroconductive material. In particular, it is preferable to use any of the various types of thermosetting resins listed above as examples of the resin that constitutes the dielectric layers 12a and 12b. In the case where a thermosetting resin is used as the resin, an A-stage thermosetting resin is filled into the first through hole 15, and then cured. As a result, a filler 16 that is a cured resin is formed in the first through hole 15. The first through hole 15 is completely filled with the filler 16.

After the first through hole 15 has been filled with the filler 16, as shown in FIG. 3(c), a second through hole 17 is formed. The second through hole 17 is formed at a position where the filler 16 has been filled. Also, the second through hole 17 is formed so as to extend through the multi-layered board 10 in the thickness direction thereof. The second through hole 17 preferably has a shape similar to the shape of the first through hole 15 when the multi-layered board 10 is viewed in planar view. In particular, the second through hole 17 and the first through hole 15 have circular shapes (perfect circular shapes) when the multi-layered board 10 is viewed in planar view. The second through hole 17 has a diameter smaller than the diameter of the first through hole 15. The second through hole 17 is preferably formed such that the centroid of the first through hole 15 and the centroid of the second through hole 17 coincide with each other when the multi-layered board 10 is viewed in planar view. For example, in the case where the second through hole 17 and the first through hole 15 have circular shapes when the multi-layered board 10 is viewed in planar view, the second through hole 17 is preferably formed such that both of the through holes 17 and 15 are concentrically arranged. As a result, after the second through hole 17 has been formed, the shape of the filler 16 is changed from a columnar shape to a tubular shape. Accordingly, the inner wall of the second through hole 17 is made of a non-electroconductive material.

Figure 4:
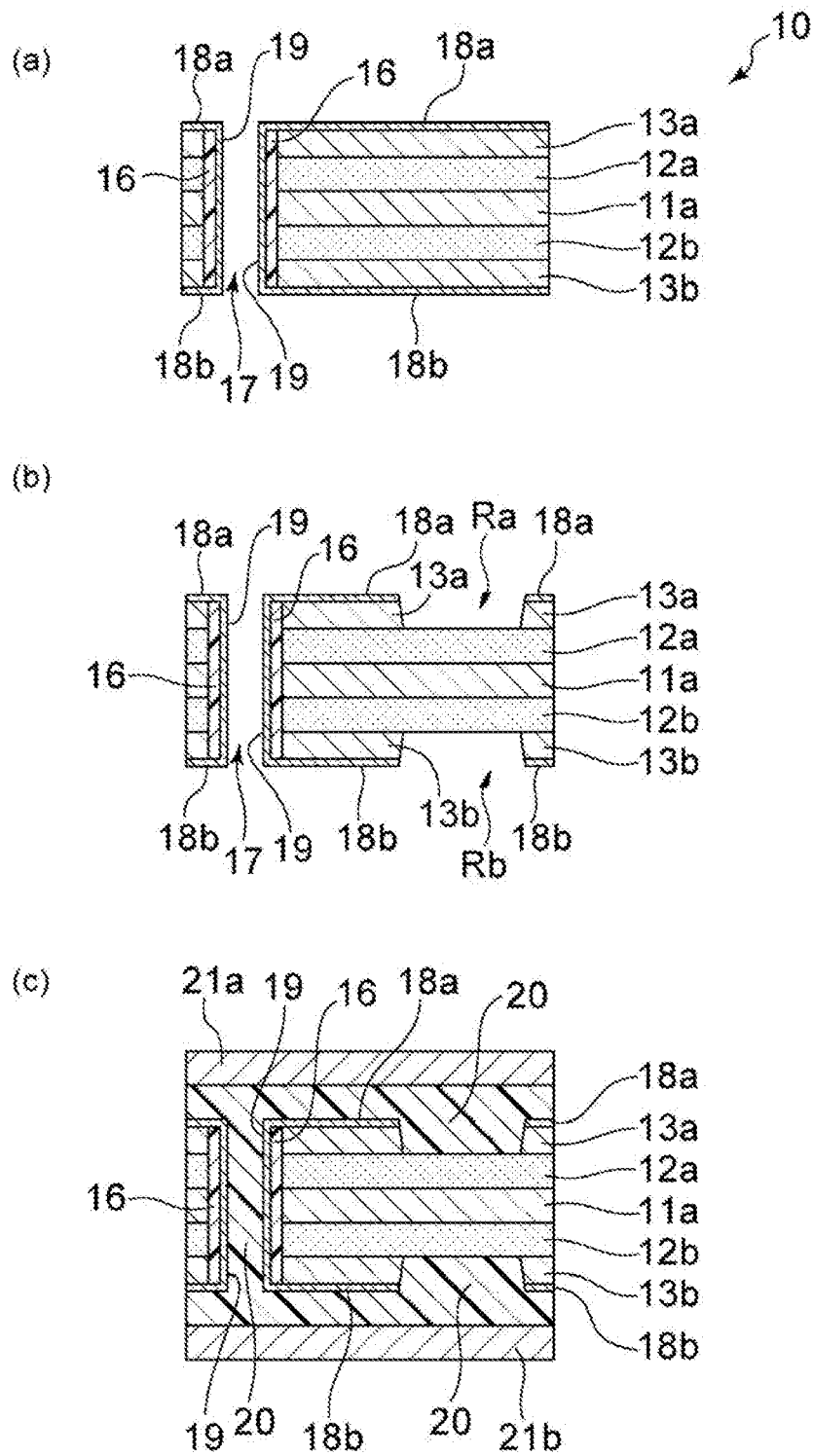
FIGS. 4(a) to 4(c) are schematic diagrams showing a sequence of steps of producing a multi-layer printed wiring board, which is performed after FIG. 3(c).

After the second through hole 17 has been formed in the manner described above, as shown in FIG. 4(a), third conductive layers 18a and 18b are formed on the outer surfaces of the first and second outer surface conductive layers 13a and 13b in the multi-layered board 10. At the same time, a fourth conductive layer 19 is formed on the inner wall of the second through hole 17. The fourth conductive layer 19 is formed so as to electrically connect the two third conductive layers 18a and 18b. The fourth conductive layer 19 is formed on the surface of the filler 16 that is made of a non-electroconductive material, and the fourth conductive layer 19 and the middle conductive layer 11a are insulated by the filler and electrically disconnected from each other. The third conductive layers 18a and 18b and the fourth conductive layer 19 are formed using, for example, an electroless plating method, but the method is not limited thereto.

Next, as shown in FIG. 4(b), patterning is performed on the multi-layered board 10 so as to form a circuit. The diagram shows a step of performing patterning on the first outer surface conductive layer 13a and the second outer surface conductive layer 13b including the third conductive layers 18a and 18b so as to form a circuit. As the patterning for forming a circuit, any of various types of lithography methods known in the technical field of the invention can be used as appropriate. In the case where patterning is performed by partially removing the third conductive layers 18a and 18b, the first outer surface conductive layer 13a and the second outer surface conductive layer 13b, it is preferable to perform patterning such that a first cavity portion Ra that is at least one removed portion of the first outer surface conductive layer 13a and a second cavity portion Rb that is at least one removed portion of the second outer surface conductive layer 13b overlap when the multi-layered board 10 is viewed in planar view.

After a circuit pattern has been formed, next, as shown in FIG. 4(c), an insulating resin layer 20 is stacked on each surface of the multi-layered board 10. As a result, the resin contained in the insulating resin layer 20 serves as a filler, and the second through hole 17 is completely filled with the insulating resin layer 20, and each surface of the multi-layered board 10 is completely covered by the insulating resin layer 20. As the insulating resin layer 20, any material known in the technical field of the invention can be used without any particular limitation. In general, an insulating resin layer 20 contains a B-stage thermosetting resin as a non-electroconductive material. Accordingly, in the case of a stack that uses an insulating resin layer 20, it is preferable that the insulating resin layer 20 is attached to the multi-layered board 10 by heating the insulating resin layer 20.

The insulating resin layer may be, for example, (i) a stack obtained by stacking the necessary number of prepregs each obtained by impregnating a fibrous material such as a glass woven fabric, glass non-woven fabric or paper with an insulating resin. The insulating resin used to impregnate the fibrous material may be, for example, epoxy resin, cyanate resin, maleimide resin, polyphenylene ether resin, phenol resin, polyimide resin, or the like. Alternatively, the insulating resin layer may be (ii) an insulating resin layer made of epoxy resin, polyimide resin, polyester resin, or the like (or in other words, a layer that does not contain a fibrous material). Irrespective of which of (i) and (ii) is used, the insulating resin layer can contain an inorganic filler. In the case where the insulating resin layer contains an inorganic filler, the filler in the second through hole 17 is composed of an insulating resin and an inorganic filler.

After the insulating resin layer 20 has been stacked, as shown in FIG. 4(c), fifth conductive layers 21a and 21b are formed on the surfaces of the insulating resin layers 20, respectively. The fifth conductive layers 21a and 21b may be made of, for example, metal foils.

Various types of methods can be used to stack the insulating resin layers 20 and 20, and the fifth conductive layers 21a and 21b. For example, first, semi-cured B stage insulating resin layers 20 and 20 are stacked on the surfaces of the multi-layered board 10, respectively, and fifth conductive layers 21a and 21b are stacked on the insulating resin layers 20 and 20. Then, the resulting stack is pressed under heat so as to cure the insulating resin layers 20, and as a result, the insulating resin layers 20 and 20, the fifth conductive layers 21a and 21b, and the multi-layered board 10 are bonded and integrated together. Instead of separately preparing the insulating resin layers 20 and 20, and the fifth conductive layers 21a and 21b, the above stack may be obtained by stacking resin-attached metal foils.

Figure 5:
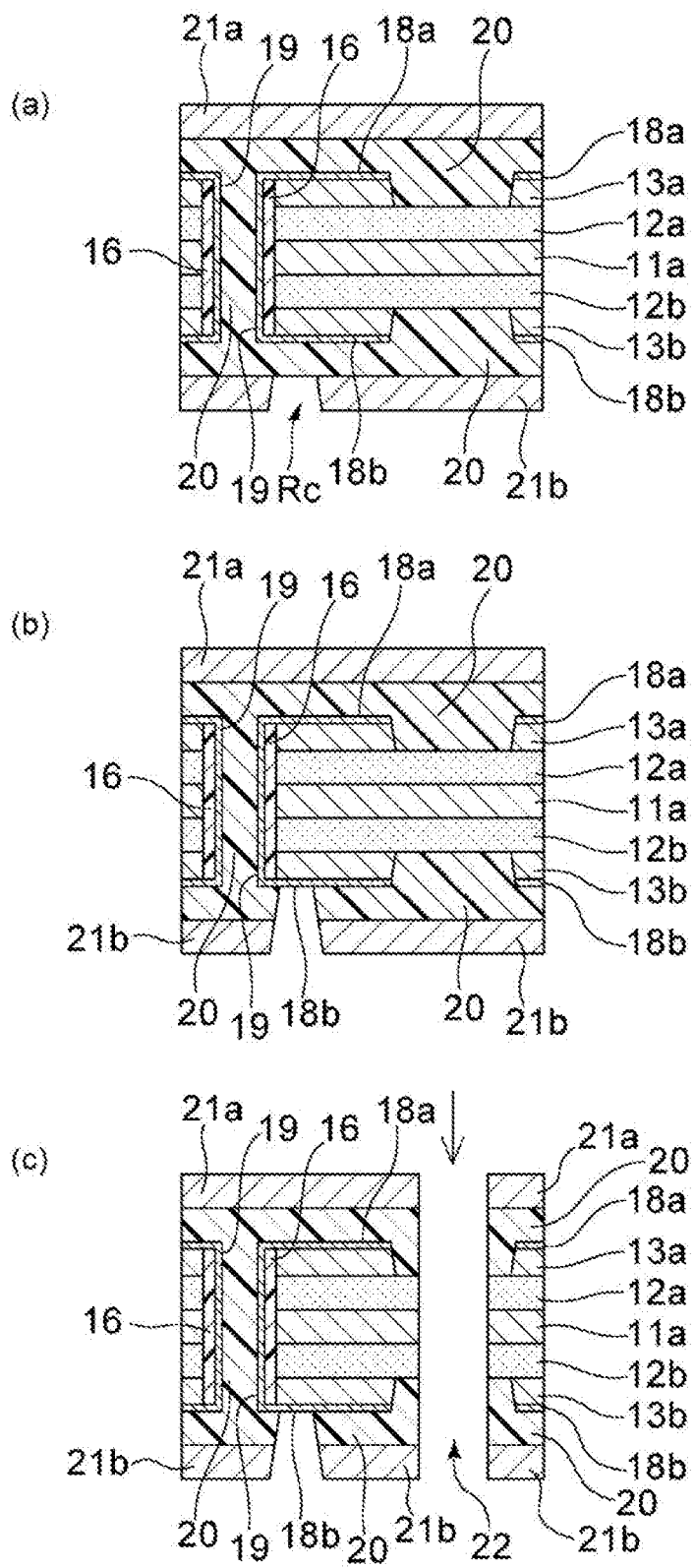
FIGS. 5(a) to 5(c) are schematic diagrams showing a sequence of steps of producing a multi-layer printed wiring board, which is performed after FIG. 4(c).

Next, as shown in FIG. 5(a), patterning is performed on the fifth conductive layer 21b. The patterning is performed to form a conformal mask for performing a hole forming process on the insulating resin layer 20. A portion of the fifth conductive layer 21b is removed through patterning, so as to form a third cavity portion Rc. After patterning has been performed, as shown in FIG. 5(b), a hole forming process using a laser light is performed on the insulating resin layer 20 through the cavity portion Rc that has been formed by partially removing the fifth conductive layer 21b through patterning. The hole forming process on the insulating resin layer 20 is performed so as to expose the third conductive layer 18b.

After the hole forming process has been performed on the insulating resin layer 20, and the third conductive layer 18b is exposed, next, as shown in FIG. 5(c), a third through hole 22 which extends through the entire multi-layered board 10 in the thickness direction is formed. The third through hole 22 is formed, for example, in a location of the first cavity portion Ra and the second cavity portion Rb that are portions that were removed from the conductive layers 13a and 13b in the step shown in FIG. 4(b) described above, in the circuit patterns formed on the first outer surface conductive layer 13a and the second outer surface conductive layer 13b.

Figure 6:
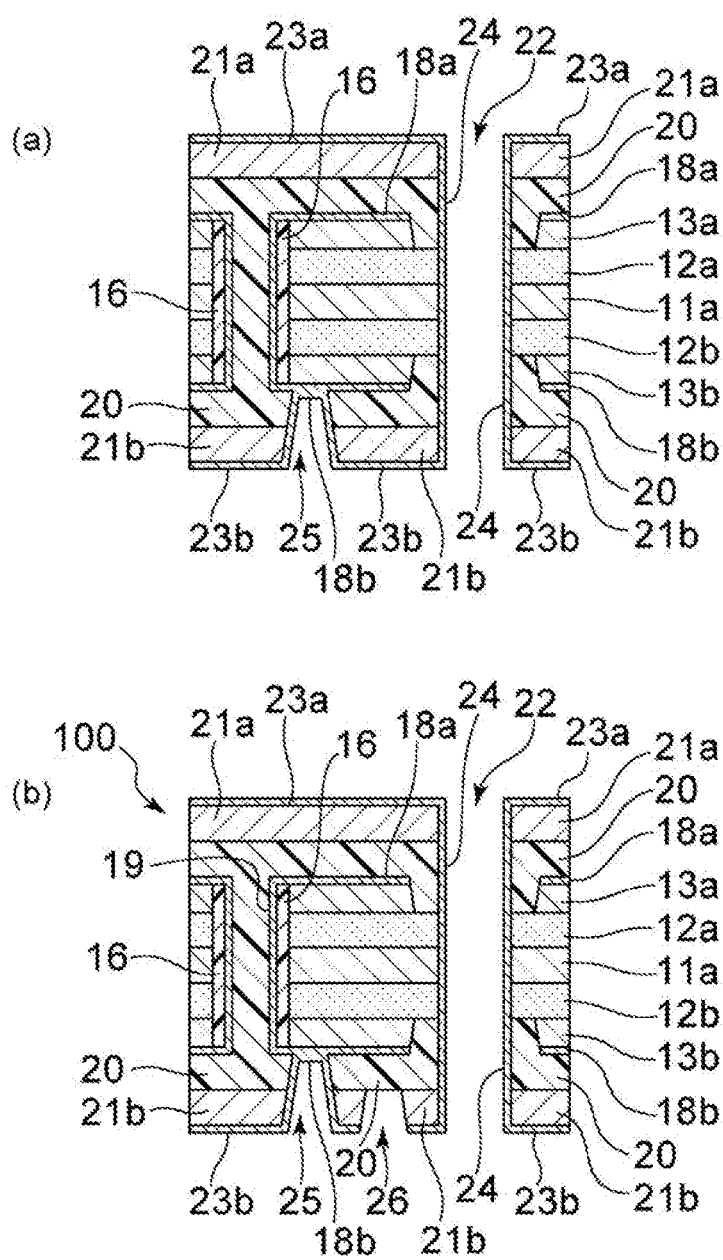
FIGS. 6(a) and 6(b) are schematic diagrams showing a sequence of steps of producing a multi-layer printed wiring board, which is performed after FIG. 5(c).

After the third through hole 22 has been formed in the manner described above, as shown in FIG. 6(a), sixth conductive layers 23a and 23b are formed on the outer surfaces of the fifth conductive layers 21a and 21b. The sixth conductive layer 23b is formed on the fifth conductive layer 21b and also formed on the side surface of a hole 25 formed in the insulating resin layer 20, such that the sixth conductive layer 23b is connected to the exposed third conductive layer 18b. At the same time, a seventh conductive layer 24 is formed on the inner wall of the third through hole 22. The seventh conductive layer 24 is formed so as to electrically connect the two sixth conductive layers 23a and 23b. Furthermore, the seventh conductive layer 24 is formed so as to be electrically connected to the fifth conductive layers 21a and 21b and the middle conductive layer 11a along a side surface of the third through hole 22. The sixth conductive layers 23a and 23b, and the seventh conductive layer 24 are formed using, for example, an electroless plating method, but the method is not limited thereto.

Finally, as shown in FIG. 6(b), the sixth conductive layer 23b and the seventh conductive layer 24 are disconnected from each other. Disconnection can be performed by, for example, performing patterning on the sixth conductive layer 23b. The disconnection location is on the fifth conductive layer 21b. There is no particular limitation on the method for disconnecting the sixth conductive layer 23b from the seventh conductive layer 24, and it is possible to use any known means such as, for example, laser light irradiation or etching. A hole 26 is formed in the fifth conductive layer 21b so as to extend through the sixth conductive layer 23b and the fifth conductive layer 21b in the thickness direction, and expose the surface of the insulating resin layer 20. As a result, the sixth conductive layer 23b and the fifth conductive layer 21b are disconnected from the seventh conductive layer 24.

In a multi-layer printed wiring board 100 (see FIG. 6(b)) obtained in the manner described above, an embedded capacitor is formed as a result of the first dielectric layer 12a being formed between the middle conductive layer 11a and the first outer surface conductive layer 13a, and the second dielectric layer 12a being formed between the middle conductive layer 11a and the second outer surface conductive layer 13b. The middle conductive layer 11a is connected, via the seventh conductive layer 24, to the sixth conductive layer 23a that is exposed on one side of the multi-layer printed wiring board 100. Also, the first outer surface conductive layer 13a and the second outer surface conductive layer 13b are connected, via the third conductive layers 18a and 18b and the fourth conductive layer 19, to the sixth conductive layer 23b that is exposed on the other side of multi-layer printed wiring board 100. Accordingly, by applying a voltage across the sixth conductive layers 23a and 23b, it is possible to cause the embedded capacitor to function.

As described above, by using the multi-layered board 10, it is possible to obtain a multi-layer printed wiring board 100 that incorporates an embedded capacitor, without compromising the uniformity in the thickness of the first dielectric layer 12a and the second dielectric layer 12b. Accordingly, in the embedded capacitor, a variation in the electrostatic capacity of the embedded capacitor is suppressed. Also, the middle conductive layer 11a, and the first outer surface conductive layer 13a and the second outer surface conductive layer 13b in the multi-layered board 10 can be easily connected to external conductive layers.

Next, another preferred method for producing a multi-layer printed wiring board by using the multi-layered board 10 will be described with reference to FIGS. 7 to 9. In the present embodiment, the steps, of which details are not given below, are the same as those of the embodiment shown in FIG. 3 to FIG. 6 above. Also, in FIGS. 7 to 9, members that are the same as those shown in FIGS. 3 to 6 are given the same reference numerals.

In the production method according to the present embodiment, steps that are the same as those performed prior to the step shown in FIG. 3(a) described in the embodiment given above are performed. Then, after the step shown in FIG. 3(a), as shown in FIG. 7(a), patterning is performed on the multi-layered board 10 so as to form a circuit. The diagram shows a step of performing patterning on the first outer surface conductive layer 13a and the second outer surface conductive layer 13b so as to form a circuit. In the case where patterning is performed by partially removing the first outer surface conductive layer 13a and the second outer surface conductive layer 13b, it is preferable to perform patterning such that a first cavity portion Ra that is at least one removed portion of the first outer surface conductive layer 13a and a second cavity portion Rb that is at least one removed portion of the second outer surface conductive layer 13b overlap when the multi-layered board 10 is viewed in planar view.

After the circuit pattern has been formed, next, as shown in FIG. 7(b), an insulating resin layer 20 is stacked on each surface of the multi-layered board 10. As a result, the resin contained in the insulating resin layer 20 serves as a filler, and the first through hole 15 is completely filled with the insulating resin layer 20, and each surface of the multi-layered board 10 is completely covered with the insulating resin layer 20. After the insulating resin layers 20 have been stacked, as shown in FIG. 7(b), fifth conductive layers 21a and 21b are formed on the surfaces of the insulating resin layers 20, respectively. A specific example of the insulating resin layers 20 is the same as that described in the embodiment shown in FIG. 4(c) above. Accordingly, the insulating resin layers 20 can contain an inorganic filler as in the embodiment shown in FIG. 4(c). In the case where the insulating resin layers contain an inorganic filler, the filler in the first through hole 15 is composed of an insulating resin and an inorganic filler.

Next, as shown in FIG. 7(c), patterning is performed on each of the fifth conductive layers 21a and 21b. The patterning is performed to form a conformal mask for performing a hole forming process on the insulating resin layer 20. A portion of the fifth conductive layers 21a and 21b is removed through patterning, so as to form a third cavity portion Rc.

After patterning has been performed, as shown in FIG. 8(a), a hole forming process using laser light is performed on the insulating resin layer 20 through the third cavity portion Rc that has been formed by partially removing the fifth conductive layers 21a and 21b through patterning (see FIG. 7(c)). The hole forming process on the insulating resin layer 20 is performed so as to expose the first outer surface conductive layer 13a and the second outer surface conductive layer 13b.

Next, as shown in FIG. 8(b), a second through hole 17 is formed. The second through hole 17 is formed at a position where the first through hole 15 has been filled with the insulating resin layer 20. Also, the second through hole 17 is formed so as to extend through the entire multi-layered board 10 in the thickness direction. The second through hole 17 has a diameter smaller than the diameter of the first through hole 15. The second through hole 17 is preferably formed such that the centroid of the first through hole 15 and the centroid of the second through hole 17 coincide with each other when the multi-layered board 10 is viewed in planar view. As a result, after the second through hole 17 has been formed, the shape of the insulating resin layer 20 in the first through hole 15 is changed from a columnar shape to a tubular shape. Accordingly, the inner wall of the second through hole 17 is made of a non-electroconductive material.

Furthermore, as shown in FIG. 8(c), a third through hole 22 is formed. The third through hole 22 is formed so as to extend through the entire multi-layered board 10 in the thickness direction. The third through hole 22 is formed, for example, in a location of the first cavity portion Ra and the second cavity portion Rb that are portions that were removed from the conductive layers 13a and 13b in the step shown in FIG. 7(a) described above, in the circuit patterns formed on the first outer surface conductive layer 13a and the second outer surface conductive layer 13b. It is preferable that the diameter of the third through hole 22 is the same as the diameter of the second through hole 17 formed earlier.

After the third through hole 22 has been formed in the manner described above, as shown in FIG. 9(a), third conductive layers 18a and 18b are formed on the outer surfaces of the fifth conductive layers 21a and 21b. The third conductive layers 18a and 18b are also formed on the side surfaces of holes 25 formed in the fifth conductive layers 21b and 21b and the insulating resin layers 20 such that the third conductive layers 18a and 18b are connected to the exposed first outer surface conductive layer 13a and the exposed second outer surface conductive layer 13b.

At the same time, a fourth conductive layer 19 is formed on the inner wall of the second through hole 17, and a seventh conductive layer 24 is formed on the inner wall of the third through hole 22. The fourth conductive layer 19 is formed so as to electrically connect the two third conductive layers 18a and 18b. Likewise, the seventh conductive layer 24 is formed so as to electrically connect the two third conductive layers 18a and 18b. Because the fourth conductive layer 19 is formed on a surface of the insulating resin layer 20 made of a non-electroconductive material, the fourth conductive layer 19 and the middle conductive layer 11a are insulated by the insulating resin layer 20 and are electrically disconnected from each other. On the other hand, the seventh conductive layer 24 is formed directly on the inner wall of the third through hole 22, and thus the middle conductive layer 11a that is exposed along the inner wall of the third through hole 22 is electrically connected to the seventh conductive layer 24.

Finally, as shown in FIG. 9(b), the third conductive layers 18a and 18b are disconnected from the seventh conductive layer 24. Disconnection can be performed by, for example, performing patterning the third conductive layers 18a and 18b using etching or the like. The disconnection location where the third conductive layers 18a and 18b and the seventh conductive layer 24 are disconnected is on the fifth conductive layers 21a and 21b. Specifically, in the fifth conductive layers 21a and 21b, holes 26 are formed so as to extend through the third conductive layers 18a and 18b and the fifth conductive layers 21a and 21b in the thickness direction thereof, and expose the surface of the insulating resin layers 20. As a result, the third conductive layers 18a and 18b and the fifth conductive layers 21a and 21b are disconnected from the seventh conductive layer 24.

In a multi-layer printed wiring board 100 (see FIG. 9(b)) obtained in the manner described above, an embedded capacitor is formed as a result of the first dielectric layer 12a being formed between the middle conductive layer 11a and the first outer surface conductive layer 13a and the second outer surface conductive layer 12b being formed between the middle conductive layer 11a and the second outer surface conductive layer 13b. The middle conductive layer 11a is connected, via the seventh conductive layer 24, to third conductive layers 18a' and 18b' that are exposed on the outer surfaces of the multi-layer printed wiring board 100. Also, the first outer surface conductive layer 13a and the second outer surface conductive layer 13b are connected directly to third conductive layers 18a" and 18b". Accordingly, by applying a voltage across the third conductive layers 18a' and 18b' and the third conductive layers 18a" and 18b", it is possible to cause the embedded capacitor to function.

As described above, with the method for producing a multi-layer printed wiring board 100 according to the present embodiment as well, by using the multi-layered board 10, it is possible to obtain a multi-layer printed wiring board 100 that incorporates an embedded capacitor, without compromising the uniformity in the thickness of the first dielectric layer 12a and the second dielectric layer 12b. Accordingly, in the embedded capacitor, a variation in the electrostatic capacity of the embedded capacitor is suppressed.

In the foregoing, the present invention has been described by way of preferred embodiments of the present invention. However, the present invention is not limited to the embodiments given above. For example, in the steps shown in FIGS. 5(a) and 7(c), in order to form a conformal mask, the third cavity portion Rc is formed by partially removing the fifth conductive layers 21a and 21b. However, the third cavity portion Rc may be omitted if the fifth conductive layers 21a and 21b are very thin.

Also, in the steps shown in FIGS. 8(a) and 8(b), the third through hole 22 is formed after the second through hole 17 has been formed. However, the order may be reversed. Alternatively, the second through hole 17 and the third through hole 22 may be formed simultaneously. In general, the through holes 17 and 22 can be formed by using a drill.

INDUSTRIAL APPLICABILITY

According to the present invention, it is possible to provide a multi-layered board wherein a variation in the capacity of the embedded capacitor is suppressed.

LIST OF REFERENCE NUMERALS 10 multi-layered board
11a middle conductive layer
12a first dielectric layer
12b second dielectric layer
13a first outer surface conductive layer
13b second outer surface conductive layer
14a first element
14b second element
15 first through hole
16 filler
17 second through hole
18a, 18b third conductive layer
19 fourth conductive layer
20 insulating resin layer
21a, 21b fifth conductive layer
22 third through hole
23a, 23b sixth conductive layer
24 seventh conductive layer
25, 26 hole
100 multi-layer printed wiring board
Ra first cavity portion
Rb second cavity portion
Rc third cavity portion

The invention claimed is:

1. A multi-layered board consisting of the following layers:
   a middle conductive layer;
   a first dielectric layer that is disposed directly on a first surface of the middle conductive layer;
   a second dielectric layer that is disposed directly on a second surface of the middle conductive layer;
   a first outer surface conductive layer that is disposed directly on an outer side of the first dielectric layer; and
   a second outer surface conductive layer that is disposed directly on an outer side of the second dielectric layer;
   wherein, in the multi-layered board, the first outer surface conductive layer serves as a first outer surface of the multi-layered board, and the second outer surface conductive layer serves as a second outer surface of the multi-layered board, the middle conductive layer is solidly formed over an entire planar direction of the multi-layered board, and the first dielectric layer and the second dielectric layer each independently have a thickness variation of 15% or less;

wherein each of the first dielectric layer and the second dielectric layer comprises dielectric particles and a resin, the dielectric particles having a relative dielectric constant of at least 50 and at most 20000;

wherein the first dielectric layer and the second dielectric layer are free of reinforcing material;

wherein each of the first dielectric layer and the second dielectric layer has a strain energy at break of at most 1.8 MJ;

wherein each of the first dielectric layer and the second dielectric layer has a tensile strength of at most 60.0 MPa; and wherein each of the first dielectric layer and the second dielectric layer has a tensile elongation at break of at least 0.05% or more, and at most 5.0%.

2. The multi-layered board according to claim 1, wherein a difference between a relative dielectric constant of the first dielectric layer and a relative dielectric constant of the second dielectric layer is 10% or less.

3. The multi-layered board according to claim 1, wherein the first dielectric layer and the second dielectric layer each independently have a thickness of 0.1 μm or more and 30 μm or less.

4. The multi-layered board according to claim 3, wherein the first dielectric layer and the second dielectric layer have the same thickness.

5. The multi-layered board according to claim 2, wherein the first dielectric layer and the second dielectric layer each independently have a thickness of 0.1 μm or more and 30 μm or less.

6. The multi-layered board according to claim 1, wherein a proportion of the dielectric particles in each of the first dielectric layer and the second dielectric layer is 60 mass % or more and 95 mass % or less.

7. The multi-layered board according to claim 6, wherein the first dielectric layer and the second dielectric layer have the same composition.

8. The multi-layered board according to claim 2, wherein a proportion of the dielectric particles in each of the first dielectric layer and the second dielectric layer is 60 mass % or more and 95 mass % or less.

9. The multi-layered board according to claim 3, wherein a proportion of the dielectric particles in each of the first dielectric layer and the second dielectric layer is 60 mass % or more and 95 mass % or less.

10. The multi-layered board according to claim 4, wherein a proportion of the dielectric particles in each of the first dielectric layer and the second dielectric layer is 60 mass % or more and 95 mass % or less.

11. The multi-layered board according to claim 1, wherein each of the conductive layers is made of a copper foil, and independently has a thickness of 0.1 μm or more and 70 μm or less.

12. The multi-layered board according to claim 2, wherein each of the conductive layers is made of a copper foil, and independently has a thickness of 0.1 μm or more and 70 μm or less.

13. The multi-layered board according to claim 3, wherein each of the conductive layers is made of a copper foil, and independently has a thickness of 0.1 μm or more and 70 μm or less.

14. A method for producing a multi-layer printed wiring board, the method comprising the steps of:
preparing the multi-layered board according to claim 1;
forming a first through hole that extends through the multi-layered board in a thickness direction of the multi-layered board; completely filling the first through hole with a non-electroconductive filler; and
forming a second through hole having a diameter smaller than a diameter of the first through hole at a position where the filler is filled, such that the second through hole extends through the multi-layered board in the thickness direction.

* * * * *